United States Patent
Yamauchi et al.

[11] Patent Number: 5,955,382
[45] Date of Patent: Sep. 21, 1999

[54] MICROWAVE EXCITATION PLASMA PROCESSING APPARATUS AND MICROWAVE EXCITATION PLASMA PROCESSING METHOD

[75] Inventors: Takeshi Yamauchi, Tokyo; Katsuaki Aoki; Masashi Yamage, both of Yokohama, all of Japan

[73] Assignee: Kabushiki Kaisha Toshiba, Kawasaki, Japan

[21] Appl. No.: 09/005,689

[22] Filed: Jan. 13, 1998

Related U.S. Application Data

[63] Continuation-in-part of application No. 08/673,189, Jun. 27, 1996, abandoned.

[30] Foreign Application Priority Data

| Oct. 30, 1995 | [JP] | Japan | 7-281685 |
| Oct. 30, 1995 | [JP] | Japan | 7-303363 |
| Mar. 13, 1997 | [JP] | Japan | 9-058677 |

[51] Int. Cl.$^6$ .................................................. H01L 21/00
[52] U.S. Cl. .............................. 438/726; 156/345; 216/69
[58] Field of Search ........................... 156/345 V, 345 P, 156/345 MN, 345 ME; 216/69, 70; 438/710, 726, 727

[56] References Cited

U.S. PATENT DOCUMENTS

5,364,519 11/1994 Fujimura et al. ............... 156/345 X
5,478,403 12/1995 Shinagawa et al. ............... 438/725 X
5,556,475 9/1996 Besen et al. ....................... 156/345 X

*Primary Examiner*—William Powell
*Attorney, Agent, or Firm*—Oblon, Spivak, McClelland, Maier & Neustadt, P.C.

[57] ABSTRACT

A microwave excitation plasma processing apparatus comprises a vacuum container having a plasma generating chamber at an upper portion thereof and a processing chamber, a gas supply pipe for supplying a process gas into the plasma generating chamber, a dielectric window arranged in an opening of an upper wall portion of the vacuum container, a rectangular waveguide arranged on the upper wall portion of the vacuum container including the dielectric window and comprising a first wall having a first surface perpendicular to a direction of electric field of a microwave to oppose the dielectric window, second walls having second surfaces parallel to the direction of electric field of the microwave and extending in a direction perpendicular to the first surface, and a third wall having a third surface which is provided on a side opposite to a microwave introducing side perpendicular to the first and second surfaces to reflect the microwave, and a microwave oscillator for introducing the microwave into the waveguide, wherein the waveguide has two slits which are formed in the first wall and located in the vicinity of the second walls, and which extend in parallel or substantially parallel to the second walls, each of the slits having a width which is smaller on a side closer to the third surface.

13 Claims, 10 Drawing Sheets

MICROWAVE →

FIG. 5

MICROWAVE →

MICROWAVE EXCITATION PLASMA PROCESSING APPARATUS AND MICROWAVE EXCITATION PLASMA PROCESSING METHOD

CROSS-REFERENCE TO RELATED APPLICATIONS

This application is a continuation-in-part of U.S. patent application Ser. No. 08/673,189 filed Jun. 27, 1996, now abandoned.

BACKGROUND OF THE INVENTION

The present invention relates to a microwave excitation plasma processing apparatus used for etching and ashing in the manufacture of a semiconductor device and the like, and a microwave excitation plasma processing method.

As a conventional microwave excitation plasma processing apparatus, one having a structure disclosed in Jpn. Pat. Appln. KOKAI Publication No. 61-131454 is known. This plasma processing apparatus has a vacuum container, a dielectric window, a waveguide, and a microwave oscillator. The vacuum container has a plasma generating chamber at its upper portion and a processing chamber which is formed under the plasma generating chamber and in which a processing target member is arranged. The dielectric window is arranged in the opening of the upper wall portion of the vacuum container. The waveguide is arranged on the upper wall portion of the vacuum container including the dielectric window. The microwave oscillator introduces a microwave into the waveguide. The waveguide has a rectangular shape. The waveguide has a first wall having a first surface opposing the dielectric window and perpendicular to the direction of electric field of the microwave, second walls having second surfaces extending perpendicularly to the first surface and parallel to the direction of electric field of the microwave, a third wall having a third surface (short-circuiting surface) which is provided on a side opposite to the microwave introducing side perpendicularly to the first and second surfaces to reflect the microwave. The opening portion is formed in an entire first wall portion of the waveguide that opposes the dielectric window. The microwave is introduced from the opening portion into the plasma generating chamber through the dielectric window.

In the microwave excitation plasma processing apparatus described above, since the distribution of electric field in the plasma generating chamber varies to make the plasma nonuniform, etching and ashing by the plasma processing apparatus become nonuniform.

SUMMARY OF THE INVENTION

It is an object of the present invention to provide a microwave excitation plasma processing apparatus which can generate a stable plasma in wide ranges of microwave outputs and pressures in the plasma generating chamber of a vacuum container, and which can efficiently etch or ash a processing target member in the processing chamber located under the generating chamber by generating a uniform plasma in the plasma generating chamber.

It is another object of the present invention to provide a microwave excitation plasma processing method which can generate a stable plasma in wide ranges of microwave outputs and pressure in the plasma generating chamber of a vacuum container, and which can efficiently etch or ash a processing target member in the processing chamber located under the generating chamber by generating a uniform plasma in the plasma generating chamber.

According to an aspect of the present invention there is provided a microwave excitation plasma processing apparatus comprising:

a vacuum container having a plasma generating chamber at an upper portion thereof and a processing chamber which is formed under the plasma generating chamber and in which a processing target member is arranged;

a gas supply pipe for supplying a process gas into the plasma generating chamber;

a dielectric window arranged in an opening of an upper wall portion of the vacuum container;

a rectangular waveguide arranged on the upper wall portion of the vacuum container including the dielectric window and comprising a first wall having a first surface perpendicular to a direction of electric field of a microwave to oppose the dielectric window, second walls having second surfaces parallel to the direction of electric field of the microwave and extending in a direction perpendicular to the first surface, and a third wall having a third surface which is provided on a side opposite to a microwave introducing side perpendicular to the first and second surfaces to reflect the microwave; and a microwave oscillator for introducing the microwave into the waveguide, wherein the waveguide has two slits which are formed in the first wall and located in the vicinity of the second walls, and which extend in parallel or substantially parallel to the second walls, each of the slits having a width which is smaller on a side closer to the third surface.

In the microwave excitation plasma processing apparatus according to the present invention, the slits formed in the waveguide preferably have a shape as follows:

(1) Each slit has such a shape that its width changes stepwise to be smaller toward the third surface (a reflecting surface).

(2) Each slit has such a shape that its width changes in a tapered manner to be smaller toward the reflecting surface.

It is preferable that the length (L) of each slit is defined as $\lambda g \times (n/2) \leq L \leq \lambda g \times (n/2) + \lambda g/8$. Wherein n is an integer, and $\lambda g$ is a the wavelength of the microwave introduced into the waveguide. If the length (L) of each slit is $\lambda g \times (n/2)$, radiation of the microwave is increased resonantly; if $\lambda g \times [(n+1)/2] > L > \lambda g \times (n/2) + \lambda g/8$, the radiation power is decreased. As radiation is not stabilized depending on the conditions (gas pressure, gas type), the efficiency of etching, ashing, and the like may be decreased.

It is preferable that an inner wall surface of the slit is inclined. The term "inclined" means that the inner wall surface extends with an inward or outward inclination from one of the surfaces of the first wall. Alternatively, it means that portions of the inner wall surface, which adjoin both surfaces of the first wall respectively, extend with an inward inclination toward each other. The angle of an inclination is preferably 30° to 45°.

It is preferable that the dielectric window has a thickness of n/2 times as thick as half the wavelength of the microwave transmitting through the window (n is an integer).

In the microwave excitation plasma processing apparatus according to the present invention, a stable plasma can be generated in the wide ranges of microwave outputs and pressures in a plasma generating chamber of a vacuum container, and a uniform plasma can be generated in the plasma generating chamber, so that a processing target member arranged in the processing chamber under the plasma generating chamber of the vacuum container can be etched or ashed efficiently.

That is, in a general microwave excitation plasma processing apparatus, the field strength of the microwave introduced into a plasma generating chamber of a vacuum container is determined by the synthetic wave of an incident wave which propagates from a microwave oscillator through a waveguide located in the upper portion of the plasma generating chamber and a wave reflected by the third surface (short-circuiting wave surface) of the waveguide. The incident wave is introduced into the plasma generating chamber through the dielectric window and propagates as it is attenuated by being absorbed by the plasma generated in the generating chamber. The microwave which has propagated to the short-circuiting surface of the waveguide is reflected by the short-circuiting surface, is introduced into the plasma generating chamber through the dielectric window, and propagates as it is attenuated by being absorbed by the plasma in the same manner as the incident wave. At this time, the distribution of electric field of the synthetic wave is strong on the short-circuiting surface side of the waveguide and is weak on the input side of the waveguide. Therefore, the distribution of electric field in the plasma generating chamber varies to make the plasma nonuniform. As a result, etching and ashing by the plasma processing apparatus become nonuniform.

The electric field of the microwave propagating in the waveguide is distributed sinusoidally with reference to the each second surface of the second walls as the node. When the microwave is of the TE01 mode, the electric field is largest at the center of the waveguide and is small near the second walls. In the conventional microwave excitation plasma processing apparatus described above, since the largest electric field of the microwave propagating in the waveguide is passed through the dielectric window serving also as a vacuum seal to be coupled with the plasma (load) directly, the microwave is absorbed by the plasma mainly at a portion (the center of the waveguide) where the field strength of the microwave is high. Therefore, the plasma has such a distribution that its density is high at the portion (the center of the waveguide) where the field strength is high and is lower toward a portion (on each second surface side of the second walls) where the field strength is low. When the central density of the plasma reaches a value to shield the microwave, the microwave is not transmitted to the plasma generating chamber. At this time, the microwave is not absorbed depending on the state of the plasma, and the reflected wave becomes so large that its average reflectance of one-minute electric discharge sometimes exceeds about 50%. Therefore, an efficiency of ionizing the gas introduced into the plasma generating chamber is decreased to decrease the etching or ashing rate.

In the microwave excitation plasma processing apparatus according to the present invention described above, when a microwave is introduced from the microwave oscillator to the waveguide, since two slits are open in the first wall having first surfaces perpendicular to the direction of electric field of the microwave, each of the slits having a width which is smaller on a side closer to the third surface of the third wall, a synthetic wave of an incident wave and a wave reflected by the third surface (short-circuiting surface) of the third wall can be uniform. As a result, since the microwave of a uniform radiation output can be radiated from the waveguide to the plasma generating chamber of the vacuum container through the dielectric window located under the waveguide, uniform plasma can be generated in the generating chamber.

The two slits are respectively open along the second walls in the first wall near the second walls parallel to the electric field of the microwave, where the field strength becomes almost zero. Therefore, the microwave incident on the waveguide can be prevented from being coupled to the electric field. Hence, the microwave radiated from the slits is not completely transmitted through the dielectric window arranged in the opening of the upper wall portion of the vacuum container but can propagate along a dielectric line (e.g., a coplanar line or a slot line). As a result, even if the microwave radiated from the slits is reflected by a high-density plasma region in the plasma generating chamber, it can propagate through the dielectric window to a low-density plasma region in the plasma generating chamber again. This increases an absorption efficiency at which the microwave is absorbed by the plasma. Therefore, a stable plasma can be generated in a wide pressure range.

A stable plasma can be generated in the wide ranges of microwave outputs and pressures in the plasma generating chamber of the vacuum container, and a uniform plasma can be generated in the plasma generating chamber, so that a processing target member arranged in the processing chamber under the plasma generating chamber of the vacuum container can be etched or ashed efficiently.

In addition, since the inner wall of the slit is inclined, the microwave can be prevented from turbulence on the inner wall surface of the slit. As a result, stable plasma can be generated in the wide ranges of microwave outputs and pressures in the plasma generating chamber of the vacuum container.

Further, if the dielectric window has a thickness of n/2 times as thick as half the wavelength of the microwave transmitting through the window (n is an integer), the efficiency of the microwave transmitting through the dielectric window can be increased. Thus, the absorption ratio of the microwave absorbed into the plasma generated in the plasma generating chamber of the vacuum container can be improved. As a result, a stable plasma can be generated in the wide ranges of microwave outputs and pressures in the plasma generating chamber of the vacuum container.

According to another aspect of the present invention, there is provided a method for processing a processing target member by means of a microwave excitation plasma processing apparatus comprising:

a vacuum container having a plasma generating chamber at an upper portion thereof and a processing chamber which is formed under the plasma generating chamber and in which the processing target member is arranged;

a gas supply pipe for supplying a process gas into the plasma generating chamber;

a dielectric window arranged in an opening of an upper wall portion of the vacuum container;

a rectangular waveguide arranged on the upper wall portion of the vacuum container including the dielectric window and comprising a first wall having a first surface perpendicular to a direction of electric field of a microwave to oppose the dielectric window, second walls having second surfaces parallel to the direction of electric field of the microwave and extending in a direction perpendicular to the first surface, and a third wall having a third surface which is provided on a side opposite to a microwave introducing side perpendicular to the first and second surfaces to reflect the microwave; and a microwave oscillator for introducing the microwave into the waveguide, said method comprising the steps of:

arranging the processing target member in the processing chamber of the vacuum container;

supplying a process gas to the plasma generating chamber through the gas supply pipe;

introducing microwave from the microwave oscillator to the waveguide after setting the container to a desired vacuum, so that a plasma is generated in the plasma generating chamber, thereby processing the processing target member in the processing chamber.

According to the method for processing a processing target member of the present invention as described above, a stable plasma can be generated in the wide ranges of microwave outputs and pressures in the plasma generating chamber of the vacuum container, and a uniform plasma can be generated in the plasma generating chamber, so that the processing target member arranged in the processing chamber under the plasma generating chamber of the vacuum container can be etched or ashed efficiently.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

The preferred embodiments of the present invention will be described in detail with reference to the accompanying drawings.

Embodiment 1

Figure 1:
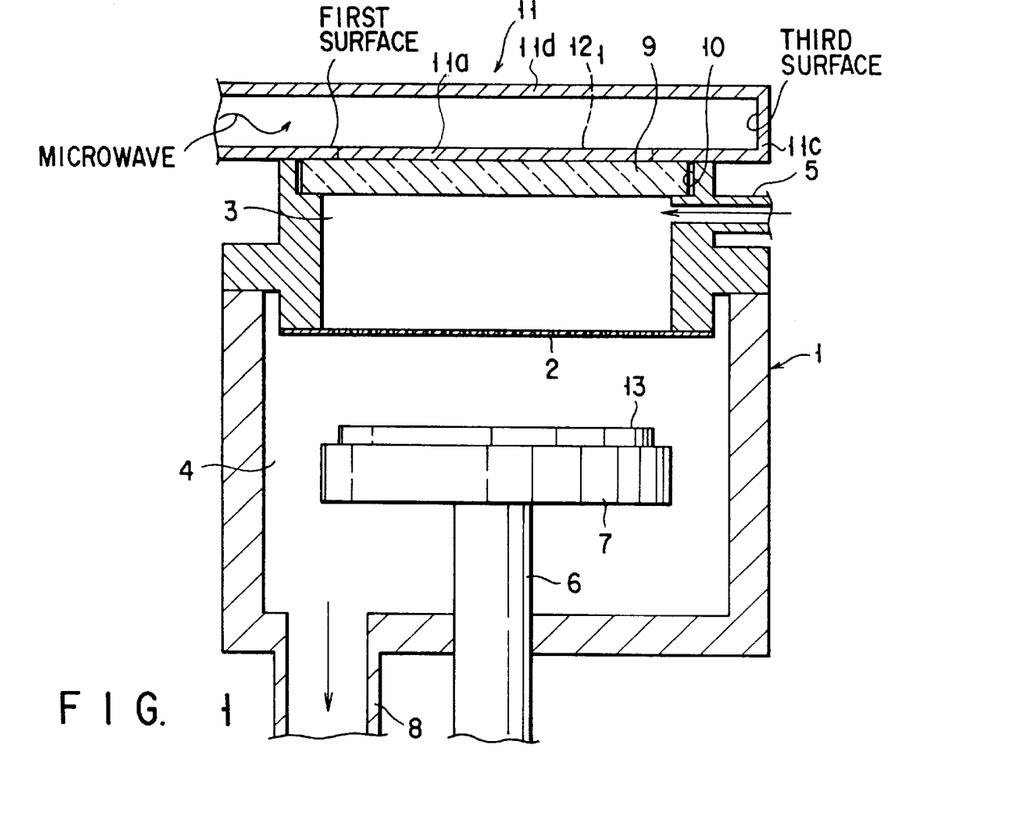
FIG. 1 is a schematic view showing a microwave excitation plasma processing apparatus according to Embodiment 1 of the present invention.

FIG. 1 is a schematic view showing a down flow type microwave excitation plasma processing apparatus applied to ashing of a resist on a wafer of Embodiment 1.

The interior of a vacuum container 1 is vertically divided into a plasma generating chamber 3 and a processing chamber 4 with a horizontally arranged diffusion plate 2 made of, e.g., a mesh-like metal member. A gas supply pipe 5 is formed in the side wall of the plasma generating chamber 3 in the upper portion of the vacuum container 1. A wafer holder 7 having a rotating shaft 6 mounted on its lower surface is rotatably arranged in the processing chamber 4. An exhaust pipe 8 is mounted on the bottom portion of the vacuum container 1 where the processing chamber 4 is formed. An exhaust system (not shown), e.g., a vacuum pump, is connected with the other end of the exhaust pipe 8.

Figure 2:
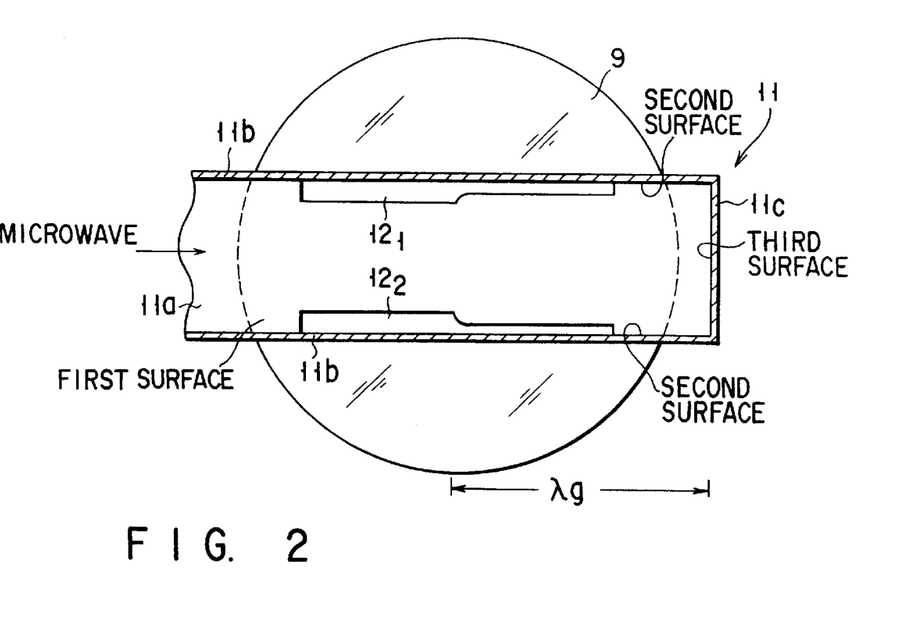
FIG. 2 is a cross-sectional view of the main part of FIG. 1.
Figure 3:
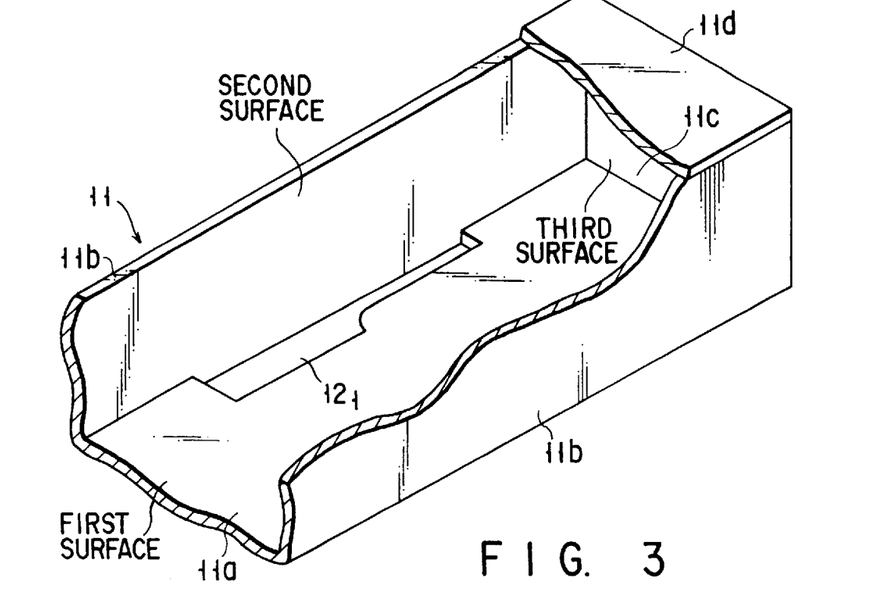
FIG. 3 is a partially cutaway perspective view showing a waveguide of FIG. 1.

A dielectric window 9 made of quartz glass is mounted in an opening portion 10 formed in the upper wall portion of the vacuum container 1. The dielectric window 9 may be made of alumina instead. A microwave generated by a microwave oscillator (not shown) is introduced into a rectangular waveguide 11. The waveguide 11 is arranged on the upper wall portion of the vacuum container 1 including the dielectric window 9. As shown in FIGS. 2 and 3, the waveguide 11 has a first wall 11a having a first surface opposing the dielectric window 9 and perpendicular to the direction of electric field of the microwave, second walls 11b having second surfaces extending perpendicularly to the first surface and parallel to the direction of electric field of the microwave, a third wall 11c having a third surface (short-circuiting surface) which is provided on a side opposite to the microwave introducing side perpendicularly to the first and second surfaces to reflect the microwave, and a fourth wall 11d opposing to the first wall 11a. Two slits $12_1$ and $12_2$ are formed in the first wall 11a of the waveguide 11, in the vicinity of the second walls 11b, and extend along the second walls 11b. The slits $12_1$ and $12_2$ have such a shape that their widths change stepwise to be smaller toward the third surface of the third wall 11c.

A method of ashing a wafer having a resist pattern formed on its surface with the microwave excitation plasma processing apparatus described above will be described.

A wafer 13 having a resist pattern formed on its surface is set on the wafer holder 7 in the processing chamber 4 of the vacuum container 1. A vacuum pump (not shown) is actuated to exhaust gas in the vacuum container 1 through the exhaust pipe 8. Simultaneously, a process gas, e.g., oxygen gas, is supplied to the plasma generating chamber 3 in the upper portion of the vacuum container 1 through the gas supply pipe 5. When the interior of the vacuum container 1 reaches a predetermined pressure, a microwave is introduced from a microwave oscillator (not shown) into the waveguide 11, so that a plasma is generated in the plasma generating chamber 3 of the vacuum container 1. The generated plasma is introduced into the processing chamber 4 through the opening of the diffusion plate 2, and active oxygen atoms in the plasma react with the resist pattern on the surface of the wafer 13 set on the wafer holder 7 in the processing chamber 4 to remove the resist pattern. In other words, so-called ashing is performed.

In introduction of the microwave into the waveguide 11, as shown in FIGS. 2 and 3, the two slits $12_1$ and $12_2$ are formed in the first wall 11a of the waveguide 11 to have such a shape that their widths change stepwise to be smaller toward the third surface (reflecting surface) of the third wall 11c. Therefore, a synthetic wave of an incident wave and a wave reflected by the third surface of the third wall 11c in the waveguide 11 are uniformed to make the radiation power of the microwave uniform. As a result, a uniform plasma can be generated in the plasma generating chamber 3 of the vacuum container 1 formed under the waveguide 11.

The two slits $12_1$ and $12_2$ are formed in the first wall 11a of the waveguide 11 opposing the dielectric window 9 and located in the vicinity of the second walls 11b and extend along the second walls 11b. More specifically, since the slits $12_1$ and $12_2$ are respectively formed in the first wall 11a located in the vicinity of the second walls 11b, where the field strength becomes almost zero, they can avoid the microwave incident on the waveguide 11 from being coupled to the electric field. For this reason, the microwave radiated from the slits $12_1$ and $12_2$ is not completely transmitted through the dielectric window 9 arranged in the opening portion 10 of the upper wall portion of the vacuum container 1 but can propagate along a dielectric line (e.g., a coplanar line or a slot line). As a result, even if the microwave radiated from the slits $12_1$ and $12_2$ is reflected by a high-density plasma region in the plasma generating chamber 3, it can propagate through the dielectric window 9 and can be radiated to a low-density plasma region in the plasma generating chamber 3 again. Since the microwave can be absorbed by the plasma efficiently, a plasma which is stable in a wide pressure range can be generated.

In fact, the present inventors confirmed through the following experiments that, with the microwave excitation plasma processing apparatus of the present invention, a plasma which is stable in a wider pressure range can be generated and that a more uniform plasma can be generated in the plasma generating chamber, when compared to a conventional microwave excitation plasma processing apparatus.

EXPERIMENTAL EXAMPLE 1

A waveguide was used in which two slits $12_1$ and $12_2$ were formed in a first wall 11a (width: 96 mm) opposing a dielectric window and located in the vicinity of second walls 11b, respectively, and extend along the second walls 11b. Each of the slits $12_1$ and $12_2$ is of such a shape that changed stepwise and had a length of 170 mm, a narrow portion with a width of 11.5 mm on a third surface (the reflecting surface) side of a third wall 11c, and a wide portion with a width of 15 mm. Note that each of the two slits $12_1$ and $12_2$ is formed in the first wall 11a such that its center in the longitudinal direction is located in the waveguide at a distance corresponding to the wavelength ($\lambda$g) of the microwave from the third surface of the third wall 11c. A plasma generating chamber 3 of a vacuum container 1 had an inside diameter of 200 mm, and a dielectric window 9 had a diameter of 240 mm.

In this microwave excitation plasma processing apparatus according to the present invention, a stable plasma whose reflected wave was 5 W or less could be generated under the conditions of an electric discharge region shown in Table 1.

TABLE 1

| | |
|---|---|
| Microwave Output | 400 to 1000 W |
| Oxygen Supply Amount | 1000 sccm |
| Pressure | 5 to 200 Pa |

EXPERIMENTAL EXAMPLE 2

Figure 4:
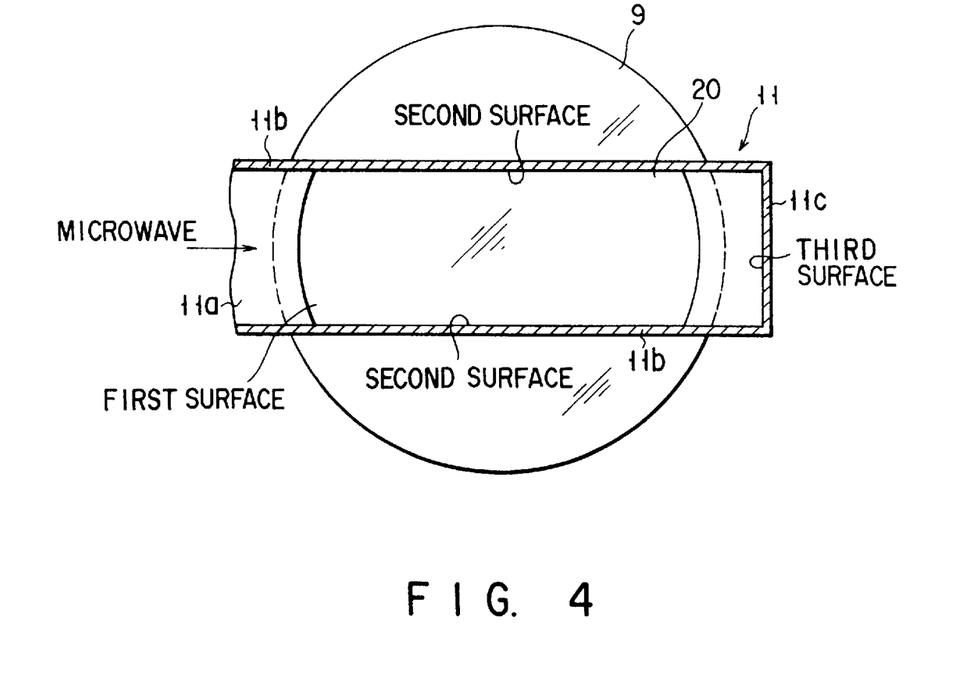
FIG. 4 is a cross-sectional view of a waveguide used in a conventional microwave excitation plasma processing apparatus.

A waveguide having an elongated open hole 20 formed in its first wall, as shown in FIG. 4, was used. The open hole 20 had a length of 200 mm, which corresponded to the inside diameter of a plasma generating chamber 3, and a width of 96 mm. A dielectric window 9 had a diameter of 240 mm, in the same manner as in Experimental Example 1 described above.

In this (conventional) microwave excitation plasma processing apparatus according to Experimental Example 2, a stable plasma whose reflected wave was 5 W or less could be generated under the conditions of an electric discharge region shown in Table 2.

TABLE 2

| | |
|---|---|
| Microwave Output | 700 to 1000 W |
| Oxygen Supply Amount | 1000 sccm |
| Pressure | 70 to 200 Pa |

From the results of Tables 1 and 2, it can be known that the microwave excitation plasma processing apparatus of the present invention can generate a stable plasma in wide ranges of microwave outputs such as 400 to 1000 W and pressures (5 to 200 Pa) when compared to those of the conventional microwave excitation plasma processing apparatus.

EXPERIMENTAL EXAMPLE 3

A microwave excitation plasma processing apparatus according to the present invention and a conventional microwave excitation plasma processing apparatus were employed. The former used a waveguide in which two slits $12_1$ and $12_2$ of such a shape that changed stepwise, as shown in FIGS. 2 and 3, and of the same size as that of Experimental Example 1 were formed in a first wall 11a (width: 96 mm) opposing a dielectric window and located in the vicinity of a second walls 11b, respectively, and extend along the second walls 11b. The latter used a waveguide in which an elongated open hole 20 as shown in FIG. 4, which had the same size as that of Experimental Example 2 was formed in its first wall 11a. A plasma was generated under the conditions shown in Table 3.

TABLE 3

| | |
|---|---|
| Microwave Output | 1 kW |
| Oxygen Supply Amount | 200 sccm |
| Pressure | 70 Pa |

Figure 5:
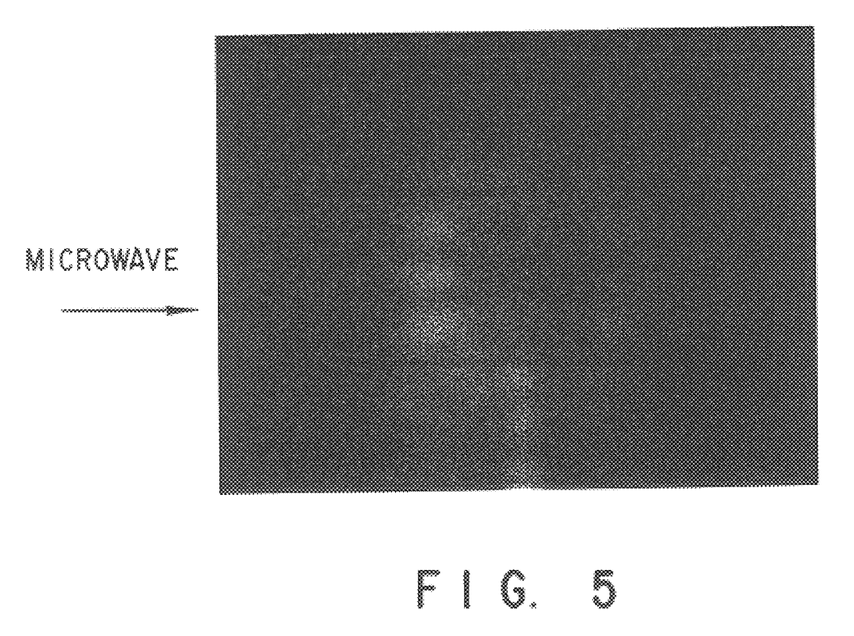
FIG. 5 is a photograph obtained by photographing a plasma generating state in a plasma generating chamber from the bottom portion side of the vacuum container of a microwave excitation plasma processing apparatus according to the present invention.
Figure 6:
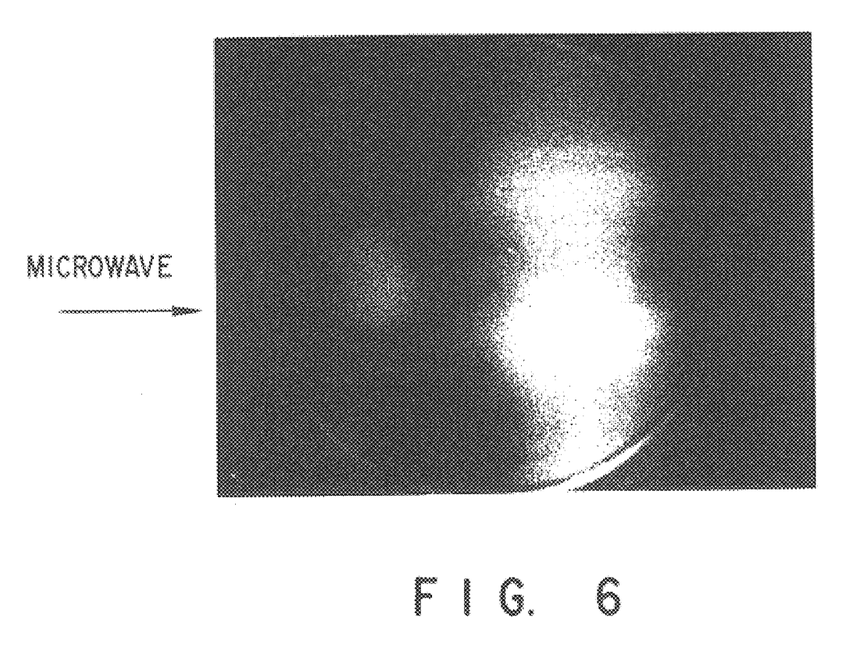
FIG. 6 is a photograph obtained by photographing a plasma generating state in the plasma generating chamber from the bottom portion side of the vacuum container of the conventional microwave excitation plasma processing apparatus.

FIG. 5 is a photograph obtained by photographing a plasma generating state in the plasma generating chamber from the bottom portion side of the vacuum container of the microwave excitation plasma processing apparatus according to the present invention. FIG. 6 is a photograph obtained by photographing a plasma generating state in the plasma generating chamber from the bottom portion side of the vacuum container of the conventional microwave excitation plasma processing apparatus. It can be known that the microwave excitation plasma processing apparatus of the present invention which shows the plasma generating state of FIG. 5 can generate a more uniform plasma in the plasma generating chamber than that of the conventional microwave excitation plasma processing apparatus which shows the plasma generating state of FIG. 6.

Since the microwave excitation plasma processing apparatus according to the present invention can uniformly generate a plasma in a plasma generating chamber 3, it can efficiently ash a resist pattern on the surface of a wafer 13 set on a wafer holder 7 in a processing chamber 4.

Figure 7:
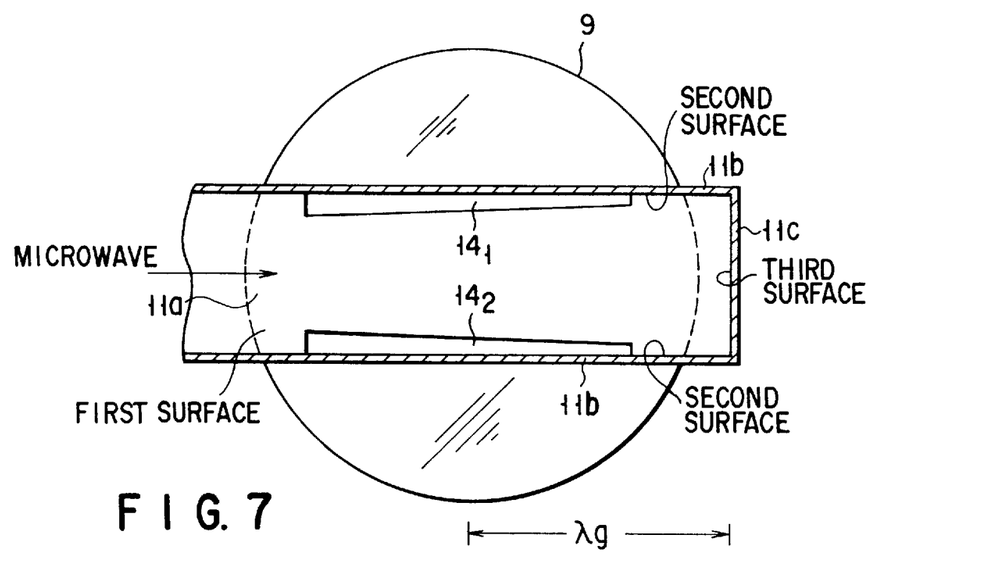
FIG. 7 is a cross-sectional view of a waveguide used in a microwave excitation plasma processing apparatus according to a modification of Embodiment 1 of the present invention.

In Embodiment 1, two slits having such a shape that changes stepwise so that their widths are reduced toward the third surface (reflecting surface) of the third wall are formed in the first wall in the vicinity of the second walls to extend along the second walls. However, the present invention is not limited to this. A waveguide 11 as shown in FIG. 7 is used in which the two slits $14_1$ and $14_2$, which are tapered so that their widths are reduced toward its third surface (reflecting surface) of a third wall 11c and are formed in a first wall 11a opposing a dielectric window and located in the vicinity of second walls 11b, respectively, and which extend along the second walls 11b, in the introduction of a microwave into the waveguide. Nonetheless, a stable plasma can be generated in wide ranges of microwave outputs and pressures, and a uniform plasma can be generated in the plasma generating chamber, in the same manner as in Embodiment 1 described above.

The microwave excitation plasma processing apparatus according to the present invention is not limited to ashing for removing a resist pattern on a semiconductor wafer, but can similarly be applied to etching of a semiconductor wafer or various types of films on a semiconductor wafer or a glass substrate. For example, when the microwave excitation plasma processing apparatus according to the present invention is applied to etching of a polysilicon film on a semiconductor substrate, $CF_4$ or $SF_6$ gas is used as a process gas which is supplied to the gas supply pipe.

Embodiment 2

Figures 8A, 8B:
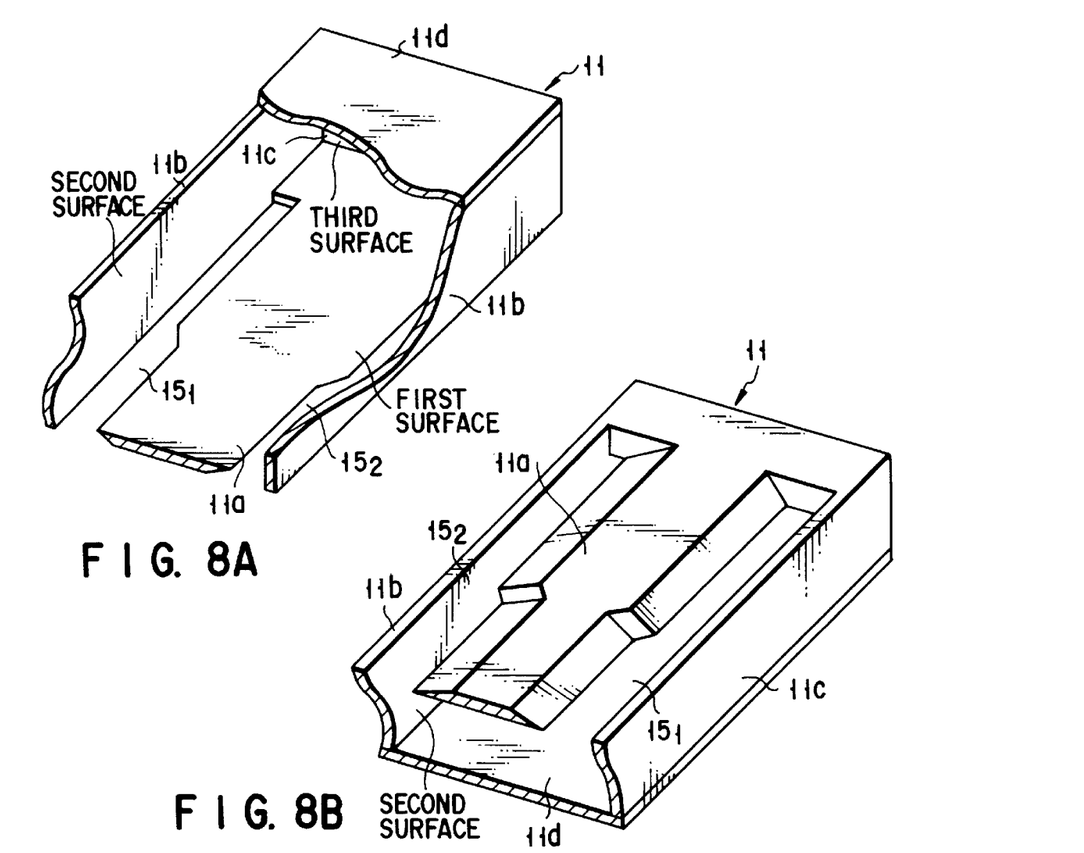
FIG. 8A is a partially cutaway perspective view showing a waveguide of a microwave excitation plasma processing apparatus according to Embodiment 2 of the present invention.
FIG. 8B is a partially cutaway perspective view from the bottom of the waveguide shown in FIG. 8A.

FIGS. 8A and 8B show the waveguide 11 arranged on the upper wall portion of the vacuum container 1 including the dielectric window 9 of the microwave excitation plasma processing apparatus shown in FIG. 1. The waveguide 11 has a first wall 11a having a first surface opposing the dielectric window 9 and perpendicular to the direction of electric field of the microwave, second walls 11b having second surfaces extending perpendicularly to the first surface and parallel to the direction of electric field of the microwave, a third wall 11c having a third surface (short-circuiting surface) which is provided on a side opposite to the microwave introducing side perpendicularly to the first and second surfaces to reflect the microwave, and a fourth wall 11d opposing to the first wall 11a. Two slits $15_1$ and $15_2$ are formed in the first wall 11a of the waveguide 11, in the vicinity of the second walls 11b, and extend along the second walls 11b. The slits $15_1$ and $15_2$ have such a shape that their widths change stepwise to be smaller toward the third surface. Inner wall surfaces of the slits $15_1$ and $15_2$ are inclined outward from an inner surface of the first wall 11a at an angle of, for example 30°.

In the microwave excitation plasma processing apparatus of Embodiment 2, since inner wall surfaces of the slits $15_1$ and $15_2$ are inclined outward from an inner surface of the first wall 11a, it is possible to prevent turbulence of the microwave which is radiated on the dielectric window under the slits $15_1$ and $15_2$ therethrough. As a result, the processing target member in the plasma generating chamber can be processed with a stable plasma in the wide ranges of microwave outputs and pressures.

Figure 9:
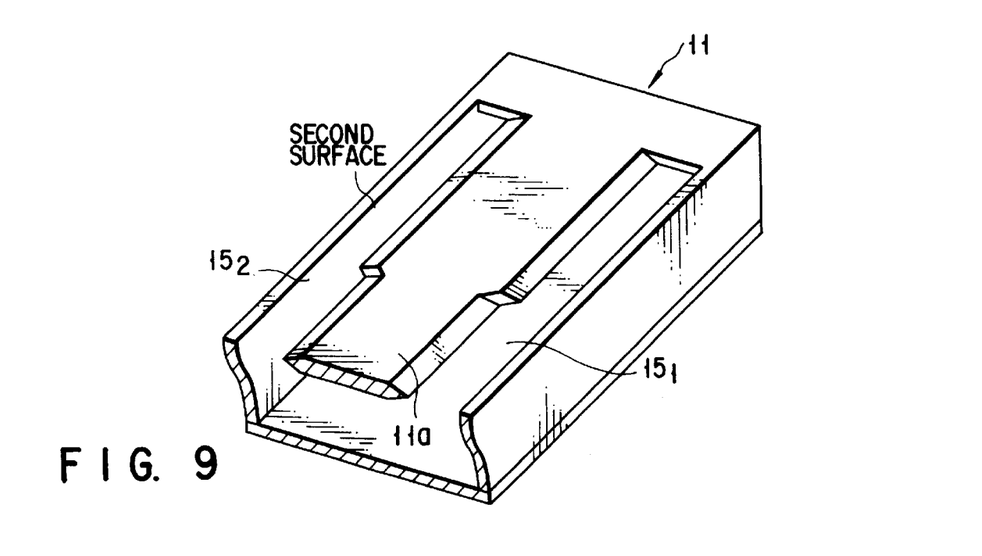
FIG. 9 is a partially cutaway perspective view from the bottom of a waveguide of a microwave excitation plasma processing apparatus according to a modification of Embodiment 2 of the present invention.

According to Embodiment 2, the inner wall surfaces of the slits $15_1$ and $15_2$ are inclined outward. However, the inner wall surfaces of the slit can be inclined inward. Alternatively, end portions of each of the inner wall surfaces of the slits $15_1$ and $15_2$, which adjoin both surfaces of the first wall respectively, may extend with an inward inclination toward each other, as shown in FIG. 9.

Embodiment 3

In this embodiment, the dielectric window of the microwave excitation plasma processing apparatus shown in FIG. 1 has a thickness which is set in the following manner.

Assuming that in the microwave excitation plasma processing apparatus shown in FIG. 1, the microwave introduced in the waveguide 11 and radiated through the slits $12_1$ and $12_2$ formed in the first wall 11a has a wavelength λg, the wavelength λ of the microwave transmitting through the dielectric window 9 is expressed by the following equation:

$$\lambda = \lambda g / \sqrt{\epsilon}$$

where ε represents a dielectric constant. From this equation, the wavelength λ of the microwave transmitting through the dielectric window 9 made of, for example, quartz glass, is calculated at 160 mm. Therefore, if the dielectric window 9 is made of quartz glass, the thickness thereof is set to, for example, ½ of half the wavelength of the transmission microwave, 40 mm. If the dielectric window 9 is made of aluminum, the thickness thereof is set to about 25 mm.

Thus, the dielectric window 9 incorporated in the microwave excitation plasma processing apparatus shown in FIG. 1 has a thickness of n/2 (n is an integer) of half the wavelength ($\lambda/2$) of the microwave transmitting through the dielectric window 9. With this structure, the efficiency of absorbing microwave into plasma generated in the plasma generating chamber 3 can be increased. As a result, a stable plasma in wide range of pressure can be generated in the plasma generating chamber 3.

Actually, with the microwave excitation plasma processing apparatus of the present invention, the applicants confirmed that stable plasma was generated in the wider range of pressure and more uniform plasma was generated in the plasma generating chamber as compared to the conventional microwave excitation plasma processing apparatus.

EXPERIMENTAL EXAMPLE 4

Quartz glass windows having thickness of ¼ and ½ of half the wavelength $\lambda$ (160 mm) of the transmission microwave (respectively, $\lambda/8=20$ mm and $\lambda/4=40$ mm) are used as dielectric windows 9. Pressure of the plasma generating chamber is set to 14 Pa, 20 Pa, 40 Pa and 60 Pa in the microwave excitation plasma processing apparatus. Reflection power of the dielectric windows is measured in the microwave excitation plasma processing apparatus under the above different pressures, with different microwave incident powers. The results of measurement using the 20 mm thick quartz glass window are shown in FIG. 10 and those using the 40 mm thick quartz glass window are shown in FIG. 11.

Figure 10:
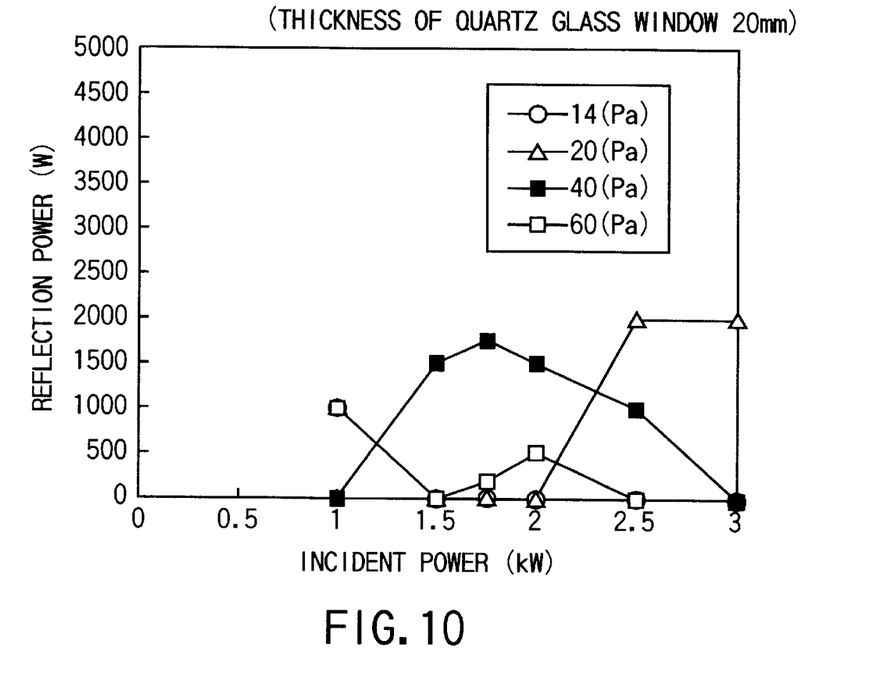
FIG. 10 is a graph showing the relationship between an incident power and a reflection power of microwave, when a 20 mm thick dielectric window made of quartz glass is used in Experimental Example 4.
Figure 11:
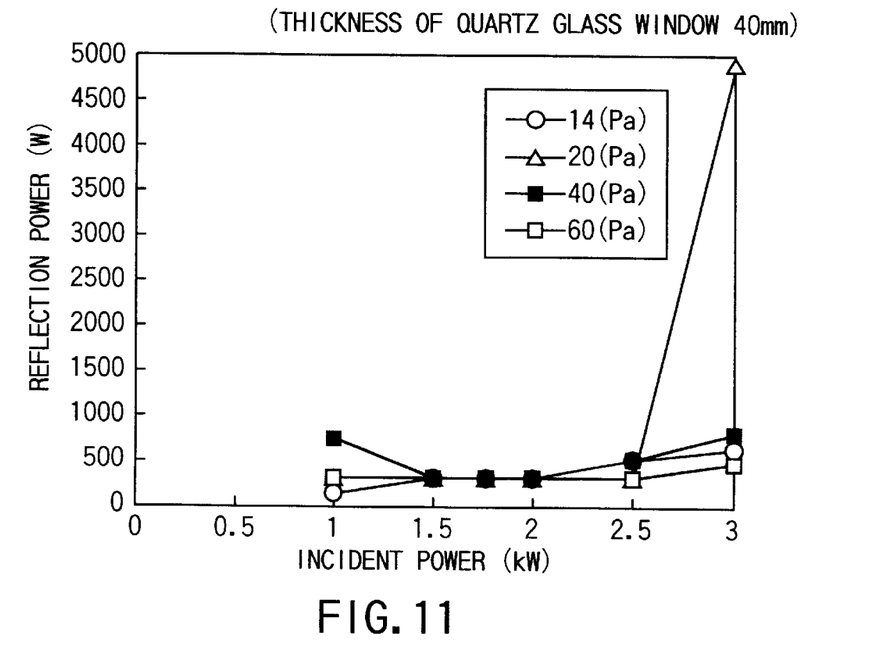
FIG. 11 is a graph showing the relationship between an incident power and a reflection power of microwave, when a 40 mm thick dielectric window made of quartz glass is used in Experimental Example 4.

As clear from FIG. 10, in the microwave excitation plasma processing apparatus using the quartz glass window having thickness of ¼ of half the wavelength $\lambda$ ($\lambda/8=20$ mm), reflection power output from the dielectric window is great in all cases where the pressure of the plasma generating chamber is 14 Pa, 20 Pa, 40 Pa or 60 Pa. In contrast, in the microwave excitation plasma processing apparatus according to the present invention using the quartz glass window having thickness of ½ of half the wavelength $\lambda$ ($\lambda/4=40$ mm), substantially no reflection power is output from the dielectric window, in any case where the pressure of the plasma generating chamber is 14 Pa, 20 Pa, 40 Pa or 60 Pa. Thus, a stable plasma can be generated in a wide pressure range.

EXPERIMENTAL EXAMPLE 5

Alumina windows having different thickness are used as dielectric windows 9. Pressure of the plasma generating chamber is set to 35 Pa, 50 Pa and 65 Pa in the microwave excitation plasma processing apparatus. Load reflection coefficient of the dielectric windows is measured in the microwave excitation plasma processing apparatus under the above different pressures, with the different thickness of the window. The results of measurement are shown in FIG. 12.

Figure 12:
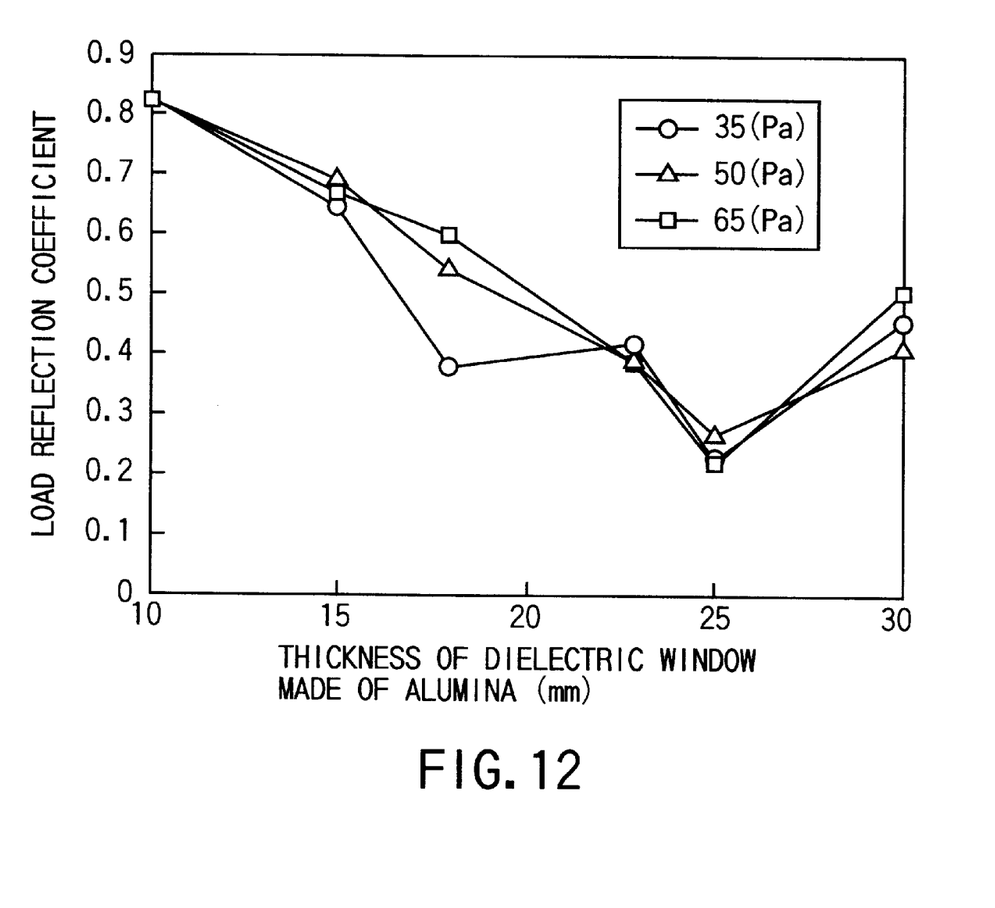
FIG. 12 is a graph showing the relationship between a thickness and a load reflection coefficient of a dielectric window made of alumina used in Experimental Example 5.

As clear from FIG. 12, in the microwave excitation plasma processing apparatus using the alumina window having thickness of 25 mm corresponding to ½ of half the wavelength $\lambda$, the load reflection coefficient of the dielectric window is small in any case where the pressure of the plasma generating chamber is 35 Pa, 50 Pa or 65 Pa. Thus, a stable plasma can be generated in a wide pressure range.

Embodiment 4

Figure 13:
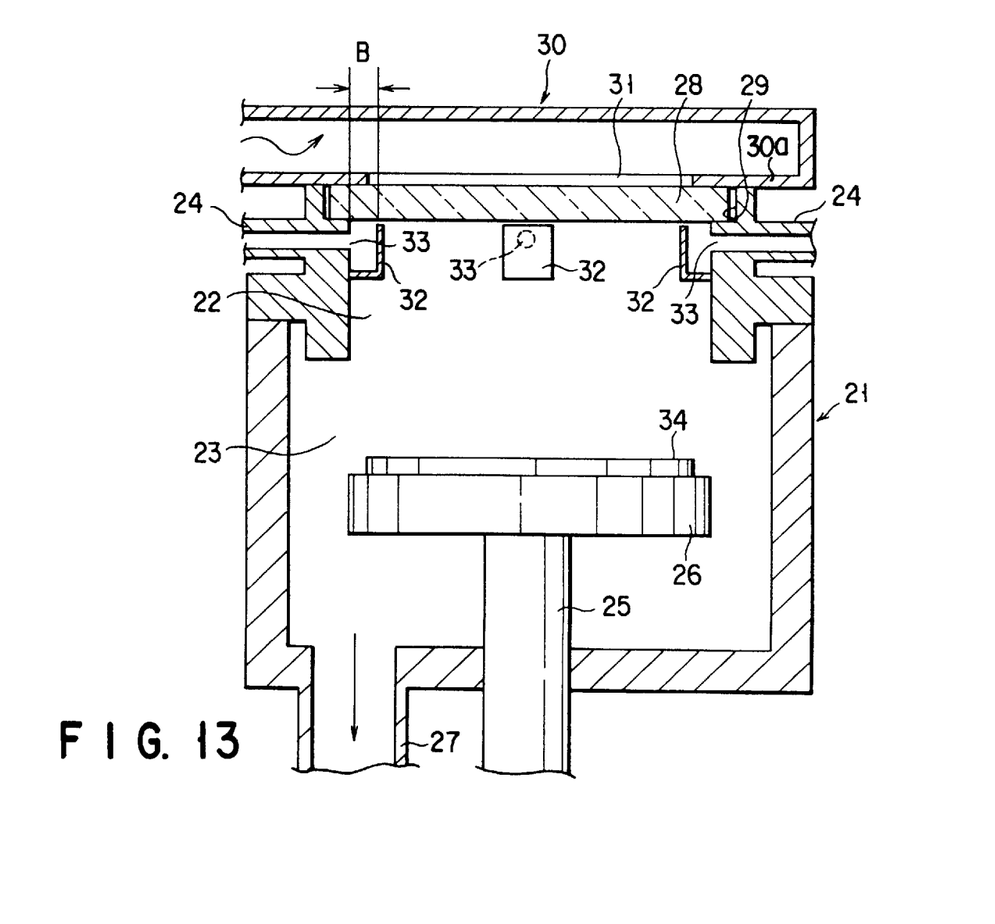
FIG. 13 is a schematic diagram showing a microwave excitation plasma processing apparatus according to Embodiment 4.

FIG. 13 is a schematic view showing a down flow type microwave excitation plasma processing apparatus applied to ashing of a resist on a wafer of Embodiment 2.

A plasma generating chamber 22 and a processing chamber 23 are respectively formed in upper and lower portions of a vacuum container 21. Four gas supply pipes 24 are formed equiangularly (90×) in the side wall of the vacuum container 21 in which the plasma generating chamber 22 is formed. A wafer holder 26 having a rotating shaft 25 mounted on its lower surface is rotatably arranged in the processing chamber 23. An exhaust pipe 27 is mounted on the bottom portion of the vacuum container 21 where the processing chamber 23 is formed. An exhaust system (not shown), e.g., a vacuum pump, is connected with the other end of the exhaust pipe 27. A dielectric window 28 made of, e.g., quartz glass, is mounted in an opening portion 29 formed in the upper wall portion of the vacuum container 21. A rectangular waveguide 30 into which a microwave generated by a microwave oscillator (not shown) is introduced is arranged on the upper wall portion of the vacuum container 21 including the dielectric window 28. An elongated open hole 31 is formed in a first wall 30a of the waveguide 30 perpendicular to the direction of electric field of the microwave to oppose the dielectric window 28.

Figures 14, 15:
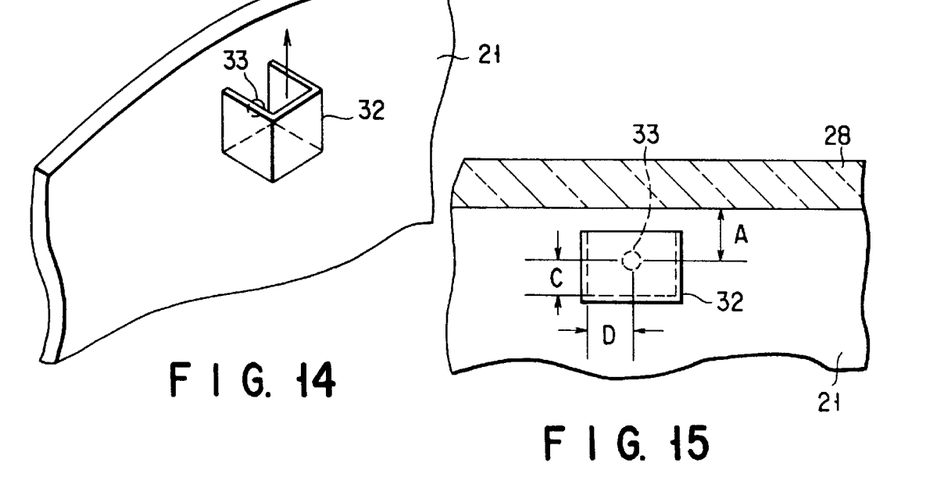
FIG. 14 is a partially enlarged perspective view showing the structure of a portion near the output portion of a gas supply pipe of FIG. 13.
FIG. 15 is a sectional view of the main part of FIG. 13.

Box-like shielding portions 32 each having an open upper portion are mounted on the inner surface of the vacuum container 21 to respectively surround output portions 33 of the gas supply pipes 24, as shown in FIGS. 14 and 15. A distance A between the center of the output portion 33 of each gas supply pipe 24 and the dielectric window 28 is preferably 2 to 20 mm. A distance B between the inner surface of the vacuum container 21 and the front surface of each box-like shielding portion 32 is preferably 1 to 10 mm. A distance C between the center of the output portion 33 of each gas supply pipe 24 and the bottom surface of the corresponding box-like shielding portion 32 is preferably 1 to 10 mm. A distance D between the center of the output portion 33 of each gas supply pipe 24 and the side surface of the corresponding box-like shielding portion 32 is preferably about 5 mm.

A method of ashing a wafer having a resist pattern formed on its surface with the microwave excitation plasma processing apparatus described above will be described.

Figure 16:
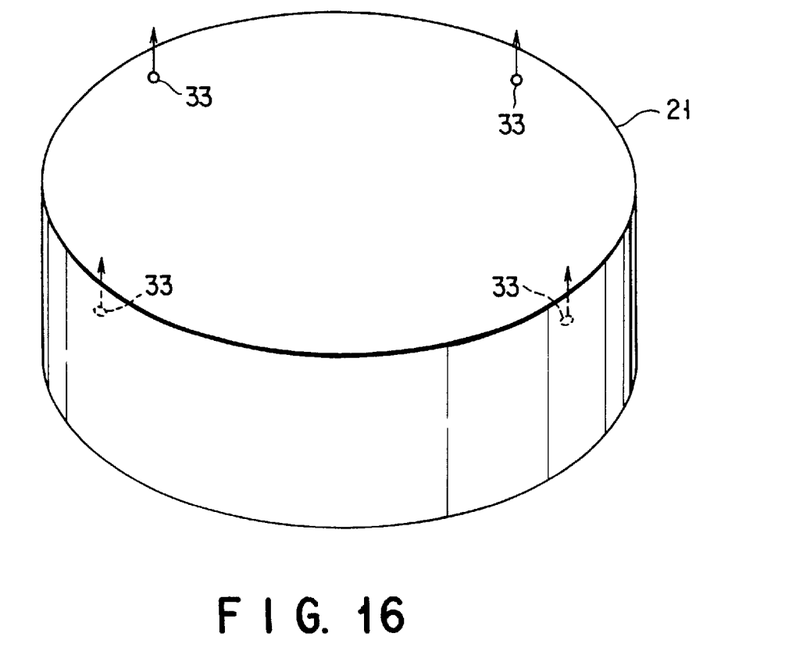
FIG. 16 is a perspective view showing the flow of oxygen gas in the microwave excitation plasma processing apparatus of FIG. 13.

A wafer 34 having a resist pattern formed on its surface is set on the wafer holder 26 in the processing chamber 23 of the vacuum container 21. A vacuum pump (not shown) is actuated to exhaust gas in the vacuum container 21 through the exhaust pipe 27. Simultaneously, oxygen gas (reaction gas) is supplied to the plasma generating chamber 22 in the upper portion of the vacuum container 21 through the four gas supply pipes 24. At this time, the box-like shielding portions 32 each having an open upper portion are mounted on the inner surface of the vacuum container 21 in the vicinities of the output portions 33 of the gas supply pipes 24 to respectively surround the output portions 33, as shown in FIG. 14. Thus, the oxygen gas blown from the output portions 33 of the gas supply pipes 24 is shielded by the shielding portions 32 and directed upward, as shown in FIGS. 14 and 16. The oxygen gas is then supplied toward the center of the plasma generating chamber 22 along the lower surface of the dielectric window 28 arranged on the upper wall portion of the vacuum container 21. In this oxygen gas supply, when the interior of the vacuum container 21 reaches a predetermined pressure, a microwave is introduced into the waveguide 30, so that a uniform plasma is generated in the plasma generating chamber 22 of the vacuum container 21. The generated plasma is introduced into the processing chamber 23, and active oxygen atoms in the plasma react with the resist pattern on the surface of the wafer 34 set on the wafer holder 26 in the processing chamber 23 to remove the resist pattern. In other words, so-called ashing is performed.

Therefore, according to the microwave excitation plasma processing apparatus of Embodiment 4, the resist pattern on the surface of the wafer 34 can be uniformly ashed at a high rate without using a diffusion plate arranged between the plasma generating chamber 22 and the processing chamber 23, and contamination of the wafer with a metal or particles which is caused by ion radiation to the diffusion plate can be prevented.

In fact, the present inventors confirmed through the following experiments that the microwave excitation plasma processing apparatus of Embodiment 4 could perform more uniform ashing at a higher rate than that in a microwave excitation plasma processing apparatus that blew gas in a different manner.

EXPERIMENTAL EXAMPLE 6

Box-like shielding portions 32 each having an open upper portion, as shown in FIGS. 14 and 15, were mounted on the inner surface of a vacuum container 21 to respectively surround output portions 33 (diameter: 1 mm) of four gas supply pipes 24. A distance A between the center of the output portion 33 of each gas supply pipe 24 and a dielectric window 28 was set to 10 mm, a distance B between the inner surface of the vacuum container 21 and the front surface of each box-like shielding portion 32 was set to 5 mm, a distance C between the center of the output portion 33 of each gas supply pipe 24 and the bottom surface of the corresponding box-like shielding portion 32 was set to 5 mm, and a distance D between the center of the output portion 33 of each gas supply pipe 24 and the side surface of the corresponding box-like shielding portion 32 was set to 5 mm. A plasma generating chamber 22 of the vacuum container 21 had a diameter of 200 mm, the dielectric window 28 had a diameter of 240 mm, and the distance from the lower surface of the dielectric window 28 to the upper surface of a wafer holder 26 was set to 120 mm. A wafer having a surface entirely coated with a photoresist film was set on the wafer holder 26.

Figure 20:
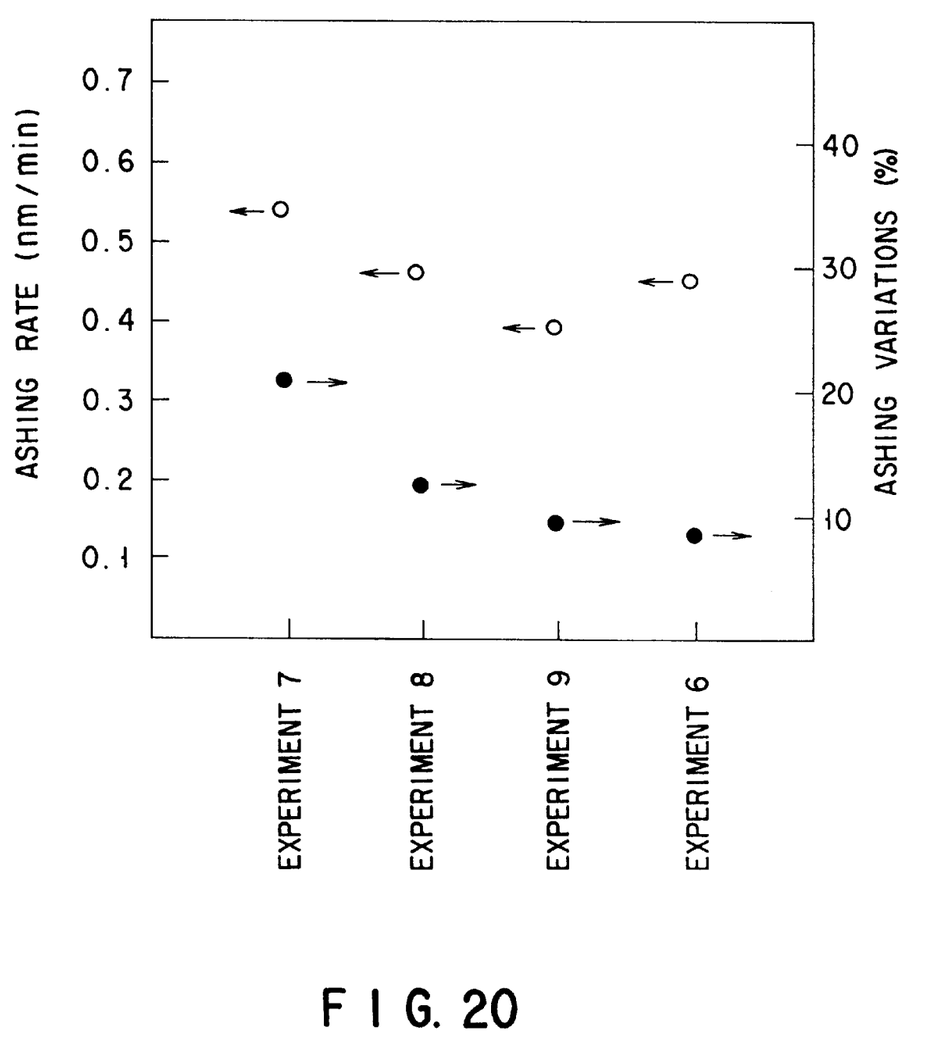
FIG. 20 is a graph showing an ashing rate and ashing variations of the microwave excitation plasma processing apparatuses of Experimental Examples 6 to 9.

This microwave excitation plasma processing apparatus generated a plasma in its plasma generating chamber under the following conditions in order to ash the resist film on the wafer set on the holder in the processing chamber. The ashing rate (solid circle) and ashing variations (hollow circle) of this ashing were calculated. FIG. 20 shows the result. The ashing variations (σ) were calculated from the maximum ashing amount (max) and the minimum ashing amount (min) in accordance with the following equation:

$$\sigma = [(max-min)/(max+min)] \times 100(\%)$$

<Conditions for Generating Plasma>
 microwave output: 1 kW
 oxygen supply amount of each supply pipe: 50 sccm
 pressure: 70 Pa

EXPERIMENTAL EXAMPLE 7

Figure 17:
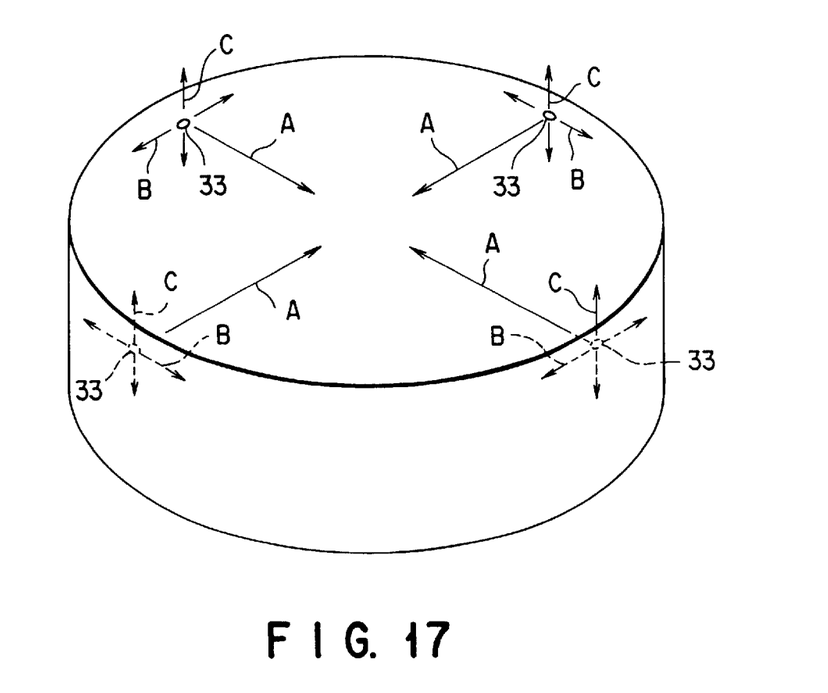
FIG. 17 is a perspective view showing the flow of oxygen gas in the microwave excitation plasma processing apparatuses of Experimental Examples 7 to 9.

Under the same conditions as in Experimental Example 6 except for not providing a shielding portion, a plasma was generated in a plasma generating chamber to ash a resist film on a wafer set on a holder in the processing chamber. The ashing rate (solid circle) and ashing variations (hollow circle) of this ashing were calculated. FIG. 20 shows the result. In Experimental Example 7, the oxygen gas was supplied as indicated by arrows A in FIG. 17.

EXPERIMENTAL EXAMPLE 8

Figure 18:
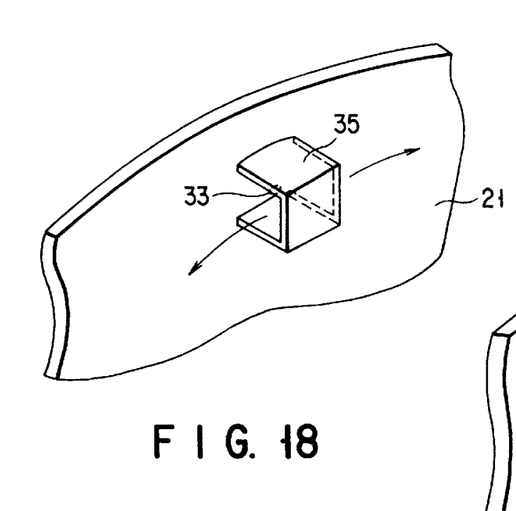
FIG. 18 is a partially enlarged perspective view showing the structure of a portion near the output portion of a gas supply pipe of Experimental Example 8.

Box-like shielding portions 35 each having open right and left side surfaces were mounted on the inner surface of a vacuum container 21 to respectively surround output portions 33 (diameter: 1 mm) of four gas supply pipes, as shown in FIG. 18. The positional relationship between the output portions 33 of the gas supply pipes and the box-like shielding portions 35, the shape of the vacuum container, and the like were the same as those of Experimental Example 6. This microwave excitation plasma processing apparatus generated a plasma in its plasma generating chamber under the following conditions in order to ash a resist film on a wafer set on a holder in the processing chamber. The ashing rate (solid circle) and ashing variations (hollow circle) of this ashing were calculated. FIG. 20 shows the result. In Experimental Example 8, the oxygen gas was supplied as indicated by arrows B in FIG. 17.

EXPERIMENTAL EXAMPLE 9

Figure 19:
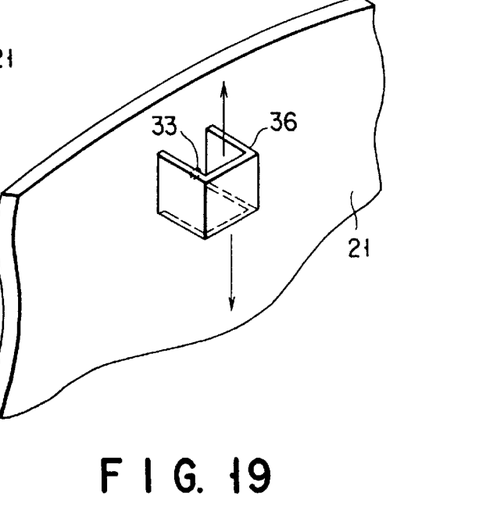
FIG. 19 is a partially enlarged perspective view showing the structure of a portion near the output portion of a gas supply pipe of Experimental Example 9.

Box-like shielding portions 36 each having an open upper wall and an open bottom portion were mounted on the inner surface of a vacuum container 21 to respectively surround output portions 33 (diameter: 1 mm) of four gas supply pipes, as shown in FIG. 19. The positional relationship between the output portions 33 of the gas supply pipes and the box-like shielding portions 36, the shape of the vacuum container, and the like were the same as those of Experimental Example 4. This microwave excitation plasma processing apparatus generated a plasma in its plasma generating chamber under the following conditions in order to ash a resist film on a wafer set on a holder in the processing chamber. The ashing rate (solid circle) and ashing variations (hollow circle) of this ashing were calculated. FIG. 20 shows the result. In Experimental Example 9, the oxygen gas was supplied as indicated by arrows C in FIG. 17.

As is apparent from FIG. 20, it can be known that the microwave excitation plasma processing apparatus of Experimental Example 6 which corresponds to Embodiment 4 can perform ashing at a higher rate and more uniformly when compared to the microwave excitation plasma processing apparatuses of Experimental Examples 7 to 9.

In the microwave excitation plasma processing apparatus according to Embodiment 4, when the distance between the lower surface of the dielectric window 9 and the upper surface of the wafer holder 7 is set to 120 mm or more, ions in the plasma are recombined before they reach the wafer. Thus, damage to the wafer caused by ion bombardment can be prevented.

In Embodiment 4 described above, four gas supply pipes are mounted on a portion of the side wall of the vacuum container which corresponds to the plasma generating chamber. However, the present invention is not limited to this, and two or three gas supply pipes, or five or more gas supply pipes can be mounted.

As has been described above in detail, the microwave excitation plasma processing apparatus according to the present invention can generate a stable plasma in the wide ranges of microwave outputs and pressures in the plasma generating chamber, and can generate a uniform plasma in the plasma generating chamber. Therefore, with the microwave excitation plasma processing apparatus according to the present invention, ashing of a resist pattern after pattern formation on a semiconductor substrate or a glass substrate, and etching of a semiconductor substrate or various types of films by using a resist pattern as a mask can be performed efficiently.

According to the microwave excitation plasma processing method of the present invention, a stable plasma can be generated in the wide ranges of microwave outputs and pressures in the plasma generating chamber, so that a processing target member arranged in the processing chamber communicating with the plasma generating chamber can be processed with plasma uniformly and satisfactorily. Therefore, a resist pattern formed on a semiconductor substrate or glass substrate can be ashed after pattern forming, and a semiconductor substrate or other films can be etched efficiently using a resist pattern as a mask.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

We claim:

1. A microwave excitation plasma processing apparatus comprising:

a vacuum container having a plasma generating chamber at an upper portion thereof and a processing chamber which is formed under the plasma generating chamber and in which a processing target member is arranged;

a gas supply pipe for supplying a process gas into the plasma generating chamber;

a dielectric window arranged in an opening of an upper wall portion of the vacuum container;

a rectangular waveguide arranged on the upper wall portion of the vacuum container including the dielectric window and comprising a first wall having a first surface perpendicular to a direction of electric field of a microwave to oppose the dielectric window, second walls having second surfaces parallel to the direction of electric field of the microwave and extending in a direction perpendicular to the first surface, and a third wall having a third surface which is provided on a side opposite to a microwave introducing side perpendicular to the first and second surfaces to reflect the microwave; and a microwave oscillator for introducing the microwave into the waveguide, wherein the waveguide has two slits which are formed in the first wall and located in the vicinity of the second walls, and which extend in parallel or substantially parallel to the second walls, each of the slits having a width which is smaller on a side closer to the third surface.

2. The apparatus according to claim 1, wherein said vacuum container is divided into said plasma generating chamber and said processing chamber by a diffusion plate arranged horizontally.

3. The apparatus according to claim 1, wherein said process gas consists of one of oxygen gas and a gas mixture containing oxygen gas and an inert gas.

4. The apparatus according to claim 1, wherein said process gas consists of one of $CF_4$ gas and $SF_6$ gas.

5. The apparatus according to claim 1, wherein said dielectric window is made of quartz glass.

6. The apparatus according to claim 1, wherein each of said slits has such a shape that a width thereof changes stepwise to be smaller toward said reflecting surface of said waveguide.

7. The apparatus according to claim 1, wherein each of said slits has such a shape that a width thereof changes in a tapered manner to be smaller toward said reflecting surface of said waveguide.

8. The apparatus according to claim 1, wherein a length (L) of each of said slits is defined as $$\lambda g \times (n/2) \leq L \leq \lambda g \times (n/2) + \lambda g/8,$$

wherein n is an integer, $\lambda g$ is a wavelength of a microwave introduced into said waveguide.

9. The apparatus according to claim 1, wherein each of said slits has a central position in a longitudinal direction which is remote from said reflecting surface as a reference by a distance corresponding to a wavelength ($\lambda g$) of the microwave introduced into said waveguide.

10. The apparatus according to claim 1, wherein inner wall surfaces of the slits are inclined.

11. The apparatus according to claim 1, wherein the dielectric window has a thickness of n/2 times as thick as half a wavelength of the microwave transmitting through the window, where n is an integer.

12. The apparatus according to claim 11, wherein the dielectric window is made of quartz glass or alumina.

13. A method for processing a processing target member by means of a microwave excitation plasma processing apparatus comprising:

a vacuum container having a plasma generating chamber at an upper portion thereof and a processing chamber which is formed under the plasma generating chamber and in which the processing target member is arranged;

a gas supply pipe for supplying a process gas into the plasma generating chamber;

a dielectric window arranged in an opening of an upper wall portion of the vacuum container;

a rectangular waveguide arranged on the upper wall portion of the vacuum container including the dielectric window and comprising a first wall having a first surface perpendicular to a direction of electric field of a microwave to oppose the dielectric window, second walls having second surfaces parallel to the direction of electric field of the microwave and extending in a direction perpendicular to the first surface, and a third wall having a third surface which is provided on a side opposite to a microwave introducing side perpendicular to the first and second surfaces to reflect the microwave; and a microwave oscillator for introducing the microwave into the waveguide, said method comprising the steps of:

arranging the processing target member in the processing chamber of the vacuum container;

supplying a process gas to the plasma generating chamber through the gas supply pipe;

introducing microwave from the microwave oscillator to the waveguide after setting the container to a desired vacuum, so that a plasma is generated in the plasma generating chamber, thereby processing the processing target member in the processing chamber.

* * * * *